United States Patent [19]
Rolfson

[11] Patent Number: 5,851,923
[45] Date of Patent: *Dec. 22, 1998

[54] INTEGRATED CIRCUIT AND METHOD FOR FORMING AND INTEGRATED CIRCUIT

[75] Inventor: J. Brett Rolfson, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 588,574

[22] Filed: Jan. 18, 1996

[51] Int. Cl.⁶ .............................. H01L 23/48; H01L 21/44
[52] U.S. Cl. ............................................. 438/668; 438/672
[58] Field of Search ................................... 438/638, 639, 438/640, 667, 668, 672, 739, 355, 363; 257/774, 775

[56] References Cited

U.S. PATENT DOCUMENTS

| | | | |
|---|---|---|---|
| 4,728,623 | 3/1988 | Lu et al. | 437/52 |
| 4,871,689 | 10/1989 | Bergami et al. | 437/67 |
| 4,979,010 | 12/1990 | Brighton | 357/34 |
| 4,997,790 | 3/1991 | Woo et al. | 437/195 |
| 5,063,175 | 11/1991 | Broadbent | 437/192 |
| 5,143,861 | 9/1992 | Turner | 437/52 |
| 5,210,054 | 5/1993 | Ikeda et al. | 438/668 |
| 5,219,793 | 6/1993 | Copper et al. | 438/638 |
| 5,270,254 | 12/1993 | Chen et al. | 437/190 |
| 5,286,674 | 2/1994 | Roth et al. | 438/639 |
| 5,327,011 | 7/1994 | Iwamatsu | 257/750 |
| 5,356,836 | 10/1994 | Chen et al. | 437/194 |
| 5,368,682 | 11/1994 | Park . | |
| 5,371,410 | 12/1994 | Chen et al. | 257/750 |
| 5,408,130 | 4/1995 | Woo et al. | 257/774 |
| 5,414,221 | 5/1995 | Gardner | 174/261 |
| 5,464,794 | 11/1995 | Lur et al. | 437/187 |
| 5,470,790 | 11/1995 | Myers et al. | 257/774 |
| 5,583,380 | 12/1996 | Larsen et al. | 257/774 |
| 5,612,252 | 3/1997 | Lur et al. | 438/668 |
| 5,616,960 | 4/1997 | Noda et al. | 257/760 |
| 5,710,460 | 1/1998 | Leidy et al. | 257/752 |

FOREIGN PATENT DOCUMENTS

| | | | |
|---|---|---|---|
| 5-29470 | 2/1993 | Japan . | |
| 5-82655 | 4/1993 | Japan | 438/355 |
| 6-283524 | 10/1994 | Japan . | |

OTHER PUBLICATIONS

Anonymous, IBM Tech. Disc. Bulletin, 38(6)(1995)405 "Method of anchoring contact or via plugs by producing lateral recess in ILD or IMD films", Jun. 1995.

Anonymous, IBM Tech. Disc. Bulletin, 34(4B)(1991)288 "Rooted refractory metal on Al–Cu . . . ", Sep. 1991.

T. Hasegawa et al., Jpn. Soc. Appl. Phys.: Proc. of 52nd Fall Meeting, 1991, p. 718 "Via filling on Al . . . using al isotropic etching", 1991 no month.

IBM Technical Disclosure Bulletin; Bipolar Transistor Structure With Extended Metal Base Contacts and Diffused or Implanted Emitter vol. 22, No. 5 pp. 2123–2126 no month.

(List continued on next page.)

*Primary Examiner*—Charles Bowers
*Assistant Examiner*—Craig Thompson
*Attorney, Agent, or Firm*—Wells, St. John, Roberts, Gregory & Matkin, P.S.

[57] ABSTRACT

A method for forming an integrated circuit comprising providing a substrate comprising a node to which electrical connection is to be made; providing a layer of material outwardly of the node; and providing an electrically conductive plug through the layer of material and in electrical connection with the underlying node, the layer of material and conductive plug forming an interlocking discontinuity which effectively prevents displacement of the electrical conductive plug from the node. The present invention also contemplates an integrated circuit wherein an interlocking discontinuity comprises a projection which extends laterally outwardly relative to an electrically conductive plug, or a projection which extends laterally outwardly from a layer of material into an electrically conductive plug.

3 Claims, 5 Drawing Sheets

OTHER PUBLICATIONS

Anonymous, IBM Tech. Disc. Bulletin, 38(6)(1995)405 "Method of Anchoring contact or via plugs by producing lateral recess in ILD or IMD films" –Jun. 1995.

Anonymous, IBM Tech. Disc. Bulleton, 34(4B)(1991)288 "Rooted refractory metal on Al–Cu . . . "–Sep. 1991.

T. Hasegawa et al., Japan Society of Applied Physics, Proc. of 52nd Fall Meeting, 1991, p. 718 "Via filling on Al . . . using Al isotropic etching" 1991 no month.

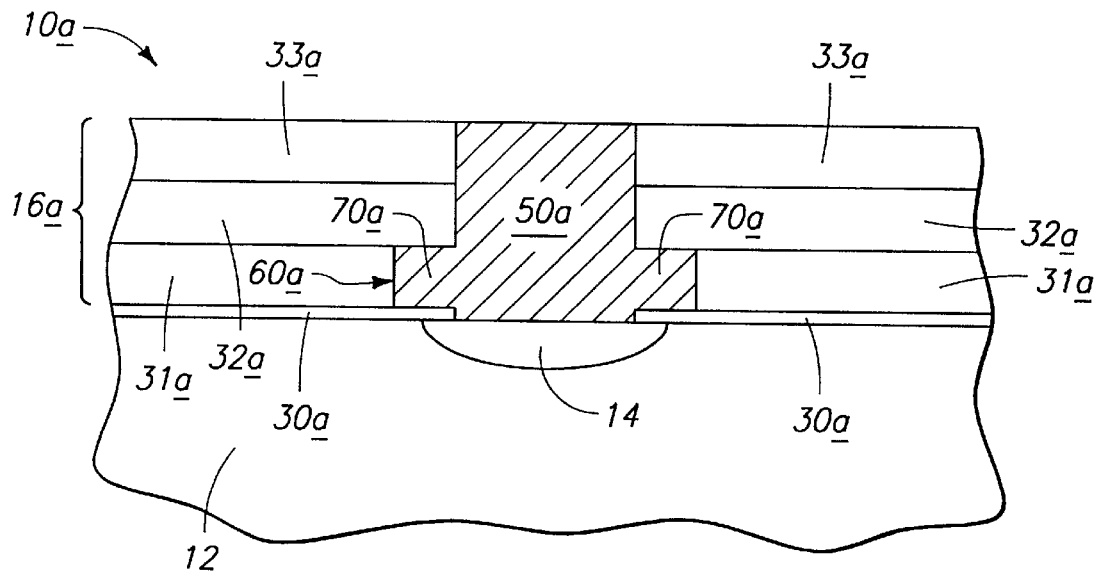
F I G 5
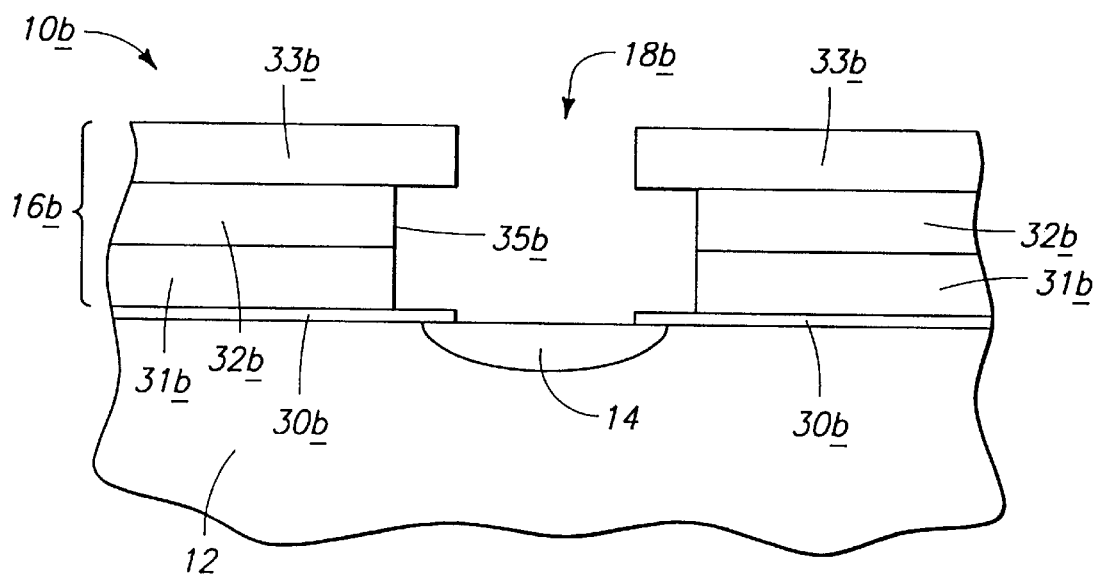
F I G 6

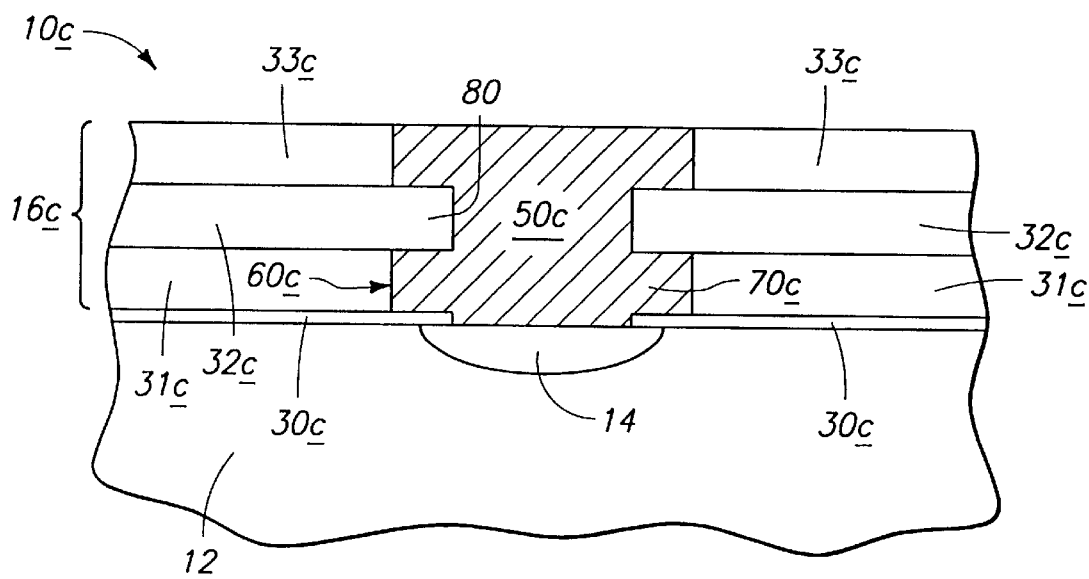
F I G. 9

5,851,923

INTEGRATED CIRCUIT AND METHOD FOR FORMING AND INTEGRATED CIRCUIT

TECHNICAL FIELD

This invention concerns methods of forming an electrical contact to a silicon substrate, and more specifically, an integrated circuit and method for forming an integrated circuit.

BACKGROUND OF THE INVENTION

In the processing of integrated circuits, electrical contact must be made to isolated active device regions formed within a wafer substrate typically comprising monocrystalline silicon. The active device regions are connected electrically to conductive paths or lines which are fabricated above an insulator layer and which covers the substrate surface. To provide electrical connection between the conductive path and active-device regions, an opening in the insulator layer is provided to enable the conductive films to contact the desired regions. Such openings are typically referred to as "contact openings" or simply "contacts."

As the active area dimensions of a transistor approached one micron in diameter, conventional process parameters resulted in intolerable increased resistance between the active regions or areas and the conductive layer. To address this, a metal silicide is provided atop the active area prior to the application of the conductive film for formation of the conductive runner. Ultimately, an electrically conductive contact filling material, such as tungsten, would be provided for making electrical connection to the contact. However, tungsten adheres poorly to the silicide material which is normally employed. Additionally, it is desirable to prevent intermixing of the contact filling material with the silicide and the underlying silicon. Accordingly, an intervening layer is typically provided to prevent diffusion of the silicon, and the silicide with the plug filling metal and to effectively adhere the plug filling metal to the underlying substrate. Such material is accordingly also electrically conductive and commonly referred to as a "barrier layer" due to the anti-diffusion properties of same.

Following the deposit of the plug filling metal in the contacts, the integrated circuit will be subjected to other processing steps which may include severe temperature cycling and chemical mechanical polishing. These further steps may have a propensity, on occasion, to cause the electrically conductive plug to be displaced from the contact opening, thus electrically disconnecting the conductive plug from the underlying node.

It would be desirable, therefore, to improve upon the prior art integrated circuits, and methods for forming an integrated circuit for forming an electrical contact to an underlying silicon substrate.

BRIEF DESCRIPTION OF THE DRAWINGS

Preferred embodiments of the invention are described below with reference to the following accompanying drawings.

FIG. 5 is a view of the FIG. 1 wafer as shown at a processing step subsequent to that shown in FIG. 4.

FIG. 6 is a view of the FIG. 1 wafer shown at another alternate processing step subsequent to that shown in FIG. 1.

FIG. 9 is a view of the FIG. 1 wafer shown at a processing step subsequent to that shown in FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method for forming an integrated circuit comprises the following steps providing a substrate comprising a node to which an electrical connection is to be made;

providing a layer of material outwardly of the node; and providing an electrically conductive plug through the layer of material into electrical connection with the underlying node, the layer of material and conductive plug forming an interlocking discontinuity which effectively prevents displacement of the electrically conductive plug from the node.

Still another aspect of the present invention relates to an integrated circuit which has an interlocking discontinuity which substantially prevents displacement of an electrically conductive plug from an associated node.

Figure 1:
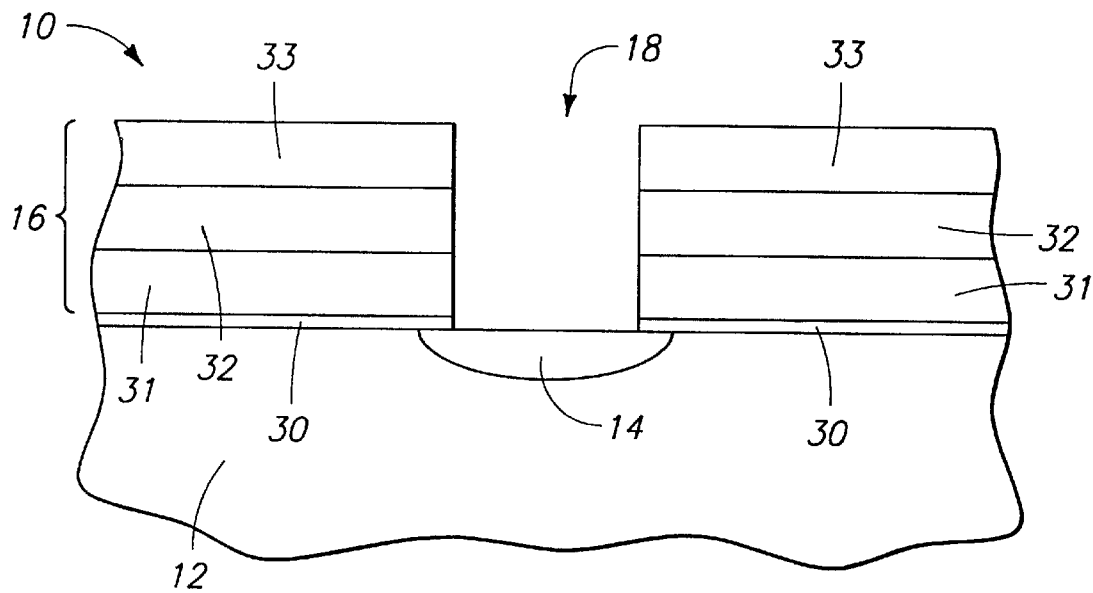
FIG. 1 is a diagrammatic sectional view of a semiconductor wafer at one processing step in accordance with the present invention.

Referring to FIG. 1, a semiconductor wafer fragment, in process, is indicated generally with reference numeral 10. Such comprises a bulk monocrystalline silicon substrate 12 having a diffusion region 14 provided therein. Diffusion region 14 might constitute, for example, an n-type region having a conductivity dopant concentration of at least $1 \times 10^{19}$ ions/cm3. Diffusion region 14 constitutes a node to which electrical connection is to be made. A layer of material 16 is provided outwardly of the substrate 12. A contact opening 18 is provided through the material 16 to the node 14.

More specifically, the preferred layer of material 16 as shown in FIG. 1 comprises a composite of multiple layers. For example, a thin layer of substantially pure silicon dioxide, preferably deposited by decomposition of TEOS may be provided outwardly of the bulk silicon substrate 12. Other materials could also be provided such as silicon nitride. As a general matter, however, layer 30 will be an electrically insulative material. Further, a first layer 31 is provided outwardly of the node 14; a second layer 32 is provided outwardly of the first layer 31; and a third layer 33 is provided outwardly of the second layer 32. The first, second and third layers 31, 32, and 33 respectively, comprise a composite which may be manufactured from several different materials. These same materials may also have dissimilar electrical characteristics. In particular, the first, second and third layers may in the alternative, be on the one hand, electrically conductive, or on the other hand, electrically insulative. The make-up of the composite will be dictated by the structure of the integrated circuit.

Figure 2:
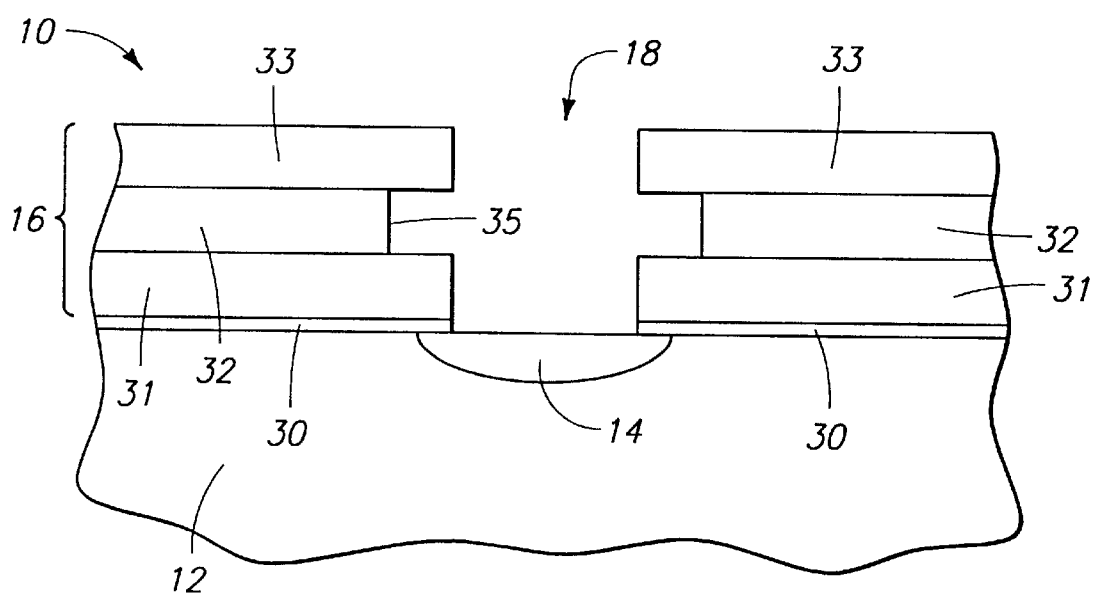
FIG. 2 is a view of the FIG. 1 wafer at a processing step subsequent to that shown in FIG. 1.

The formation of the contact opening 18, as shown in FIG. 1, is accomplished in a conventional fashion. Following the formation of the contact opening 18, an etching chemistry will be selected, based upon the chemical composition of the individual layers 31, 32, and 33, to selectively etch predetermined layers of material 16, relative to other layers of material to provide a discontinuity gap 35 (FIG. 2), in the layer of material 16. For example, and referring now to FIG. 1, a first form of the invention may include first, second and third layers 31, 32 and 33 which are electrically insulative. In this regard, the first layer comprises BPSG which is provided outwardly of the node 14, a second layer of silicon nitride 32, which is provided outwardly of the BPSG, and a third layer 33, which comprises BPSG is provided outwardly relative to the second layer 32. A masking layer (not shown) is provided, and an etching chemistry is selected that would substantially selectively etch the second layer 32 relative to the first 31 and third layers 33. Such an etching chemistry could include the use of hot phosphoric acid, for example. Other chemistries would work with equal success. A diffusion layer barrier (not shown) is provided within contact opening 18. One material of choice for use as a diffusion barrier is titanium nitride. Titanium nitride is an attractive material as a contact diffusion barrier in silicon integrated circuits because it behaves as a substantially impermeable barrier to silicon, and because the activation energy required for the diffusion of other impurities is very high. Titanium nitride is also chemically and thermodynamically stable, and exhibits typically low electrical resistivities of the transition metal carbides, borides or nitrides.

Titanium nitride can be provided or formed on the substrate in one of the following manners: a) by evaporating titanium in a nitrogen ambient; b) reactively sputtering titanium in an argon or nitrogen mixture; c) sputtering from a titanium nitride target in an inert (argon) ambient; d) sputter depositing titanium in an argon ambient and converting it to titanium nitride in a separate plasma nitridation step; or e) by low pressure chemical vapor deposition.

Figure 3:
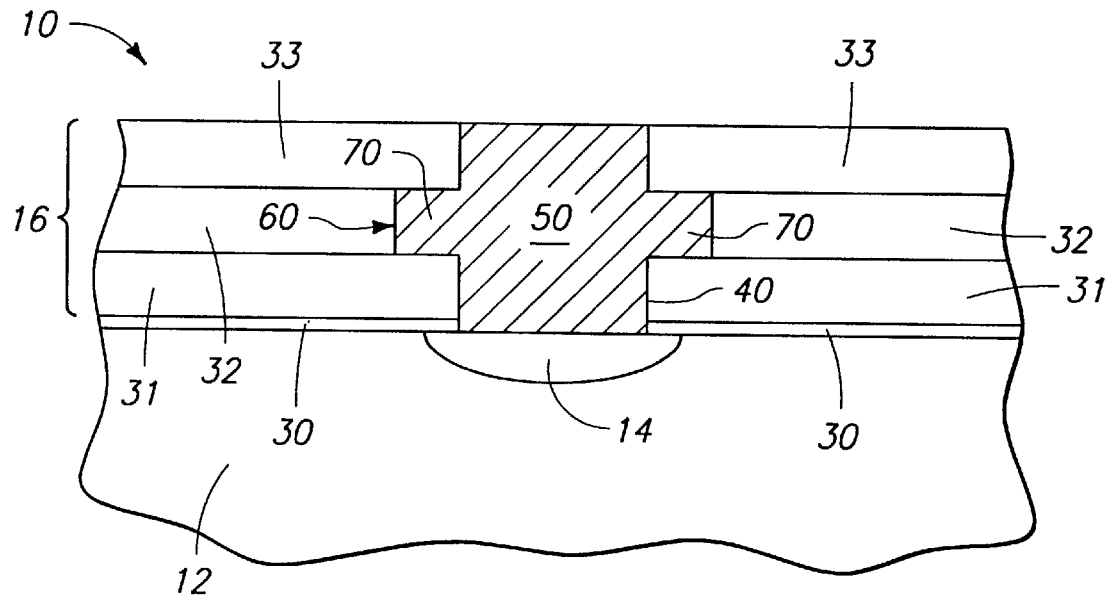
FIG. 3 is a view of the FIG. 1 wafer shown at a processing step subsequent to that shown in FIG. 2.

Following the etching of second layer 32, an electrically conductive plug 50 is provided (FIG. 3). The plug can be provided by deposition; and subsequent polishing or etchback thereof. The result is formation of a projection 70 that extends substantially laterally outwardly relative to the conductive plug and into the discontinuity gap 35, thereby forming an interlocking discontinuity 60. The interlocking discontinuity 60 would effectively prevent displacement of the electrically conductive plug 50 from the node 14 during subsequent processing steps which may include severe temperature cycling, or chemical mechanical polishing.

As was discussed above, the first, second and third layer may individually comprise, in the alternative, electrically conductive or insulative materials depending upon the construction of the integrated circuit.

Figure 4:
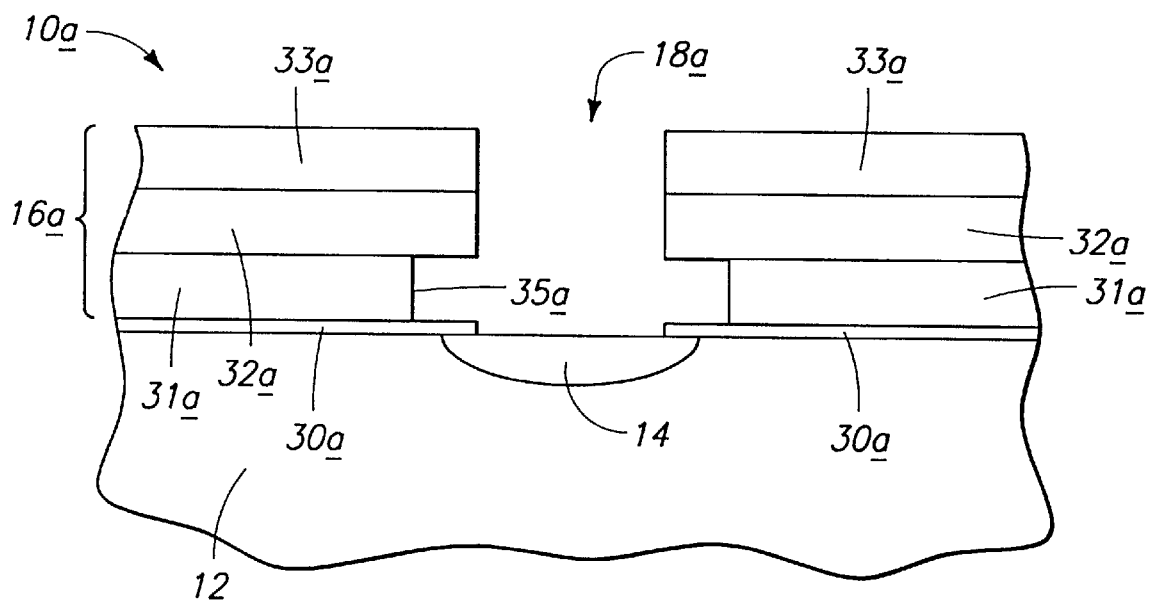
FIG. 4 is a view of the FIG. 1 wafer shown at an alternate processing step subsequent to that shown in FIG. 1.

As illustrated in FIGS. 4 and 5, a second form of the invention is shown in the form of a wafer fragment 10a. Like numerals from the first described embodiment are utilized where appropriate, with differences being indicated with the suffix "a", or with different numerals. Here, first layer 31a is isotropically etched selectively relative to the first and third layers 32a and 33a to provide the discontinuity 35a in the first layer 31a.

Figure 7:
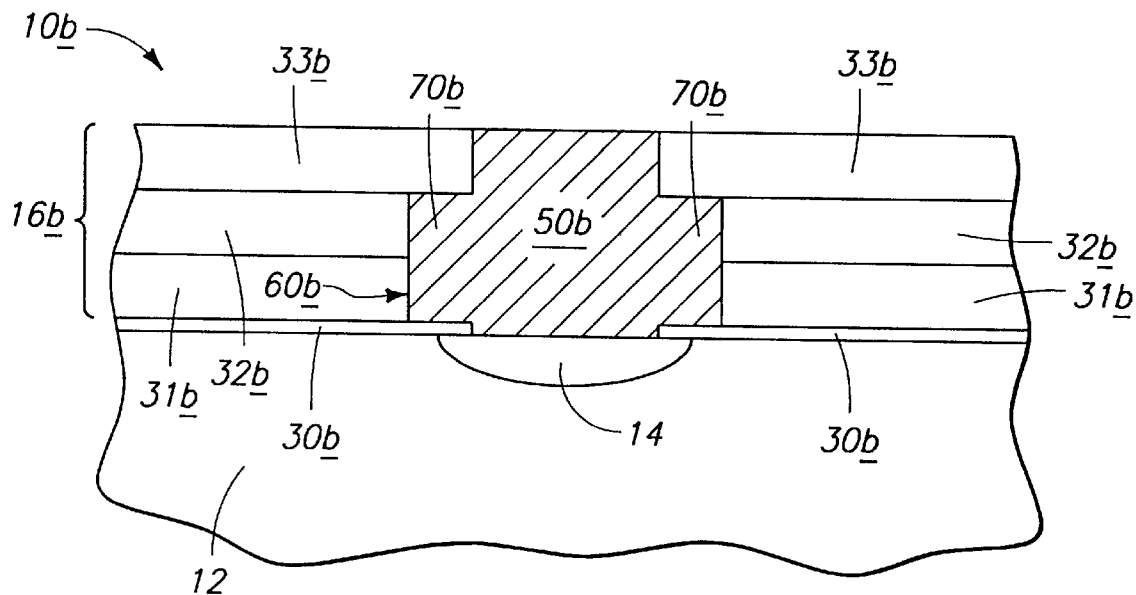
FIG. 7 is a view of the FIG. 1 wafer shown at a processing step subsequent to that shown in FIG. 6.

Another alternate wafer fragment 10b is shown in FIGS. 6 and 7. The first and second layers 31b and 32b are isotropically etched selectively relative to the third layer 33b to provide the discontinuity 35b in the first 31b and second layer 32b.

Figure 8:
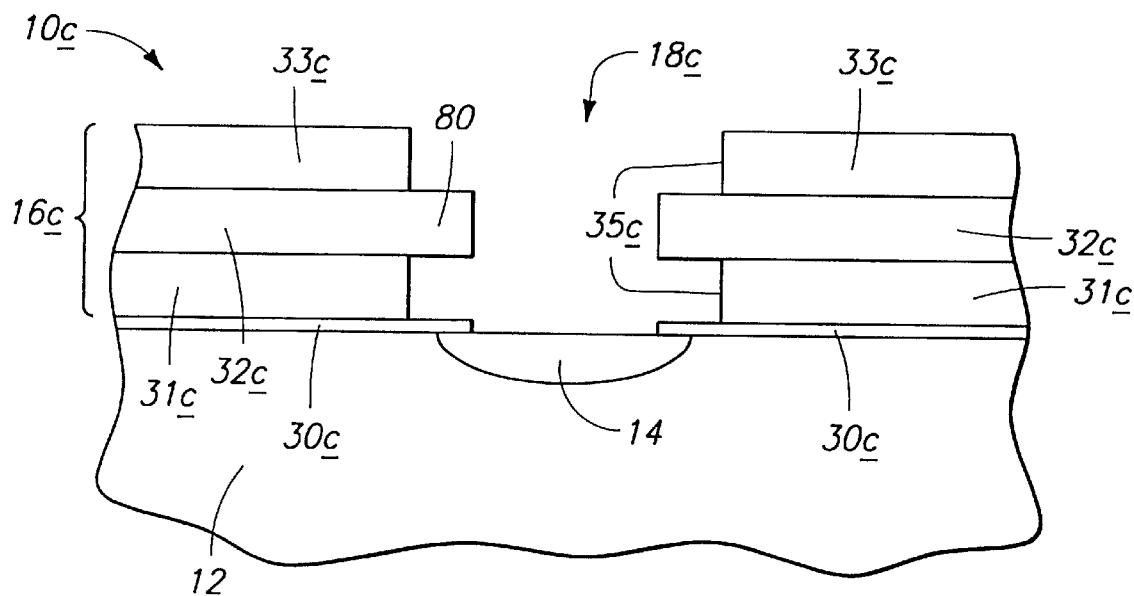
FIG. 8 is a view of the FIG. 1 wafer shown at yet another processing step subsequent to that shown in FIG. 1.

As seen in FIGS. 8, and 9, and in a fourth form of the invention, the first and third layers 31c and 33c in a wafer fragment 10c are isotropically etched selectively relative to the second layer 32c to provide the interlocking discontinuity 35c in the first 31c and third layers 33c. The forms of the invention shown in FIGS. 5 and 7, for example, results in a respective projection 70 which extends laterally outwardly relative to the respective conductive plugs 50 into the material 16. Further, the form of the invention shown in FIGS. 8 and 9 results in a projection 80 which extends laterally outwardly relative to the material 16 and into the conductive plug 50.

It will be recognized that the invention can be employed in other forms, such as in a composite construction which has only two layers, or a construction which has four or more layers. Still further, the individual layers could constitute the same material with alternating dopant species. Moreover, a form of the invention could be provided which includes multiple interlocking discontinuities having all the characteristics previously mentioned.

In compliance with the statute, the invention has been described in language more or less specific as to its structural and methodical features. It is to be understood, however, that the invention is not limited to the specific features shown and described, since the means herein disclosed comprise preferred forms of putting the invention into effect. The invention is therefore claimed in any of its forms or modifications within the proper scope of the appended claims appropriate interpreted in accordance with the Doctrine of Equivalents.

I claim:

1. A method for forming an integrated circuit comprising:

providing a substrate comprising a node to which electrical connection is to be made;

providing a layer of material outwardly of the node, and wherein the layer of material comprises a composite of a first layer which is provided outwardly by the node, a second layer which is provided outwardly of the first layer, and a third layer which is provided outwardly of the second layer; wherein the first and third layers are electrically conductive, and the second layer is electrically insulative; and isotropically etching the second layer substantially selectively relative to the first and third layers to provide a discontinuity in the second layer of material; and providing an electrically conductive plug through the layer of material in electrical connection with the underlying node and which forms an interlocking discontinuity which effectively prevents displacement of the electrically conductive plug from the node.

2. A method for forming an integrated circuit comprising:

providing a substrate comprising a node to which electrical connection is to be made;

providing a layer of material outwardly of the node, and wherein the layer of material comprises a composite of a first layer which is provided outwardly of the node, a second layer which is provided outwardly of the first layer, and a third layer which is provided outwardly of the second layer; wherein the first and third layers are electrically conductive, and the second layer is electrically insulative; and isotropically etching the first and third layers substantially selectively relative to the second layer to provide a discontinuity in the first and third layers of materials; and providing an electrically conductive plug through the layer of material in electrical connection with the underlying node and which forms an interlocking discontinuity which effectively prevents displacement of the electrically conductive plug from the node.

3. A method for forming an integrated circuit comprising:

providing a substrate comprising a node to which electrical connection is to be made;

providing a layer of material outwardly of the node, and wherein the layer of material comprises a composite of a first layer which is provided outwardly of the node, a second layer which is provided outwardly of the first layer, and a third layer which is provided outwardly of the second layer; wherein the second and third layers are electrically conductive and the first layer is electrically insulative; and isotropically etching the first layer substantially selectively relative to the second and third layers to provide a discontinuity in the first layer of material; and providing an electrically conductive plug through the layer of material in electrical connection with the underlying node and which forms an interlocking discontinuity which effectively prevents displacement of the electrically conductive plug from the node.

* * * * *